United States Patent [19]

Nishimoto et al.

[11] Patent Number: 4,884,278

[45] Date of Patent: Nov. 28, 1989

[54] SEMICONDUCTOR LASER MODULATION CONTROL SYSTEM

[75] Inventors: Hiroshi Nishimoto, Sagamihara; Takashi Touge, Tokyo; Tadashi Okiyama, Yokohama; Naoki Kuwata, Yokohama; Yasunari Arai, Tokyo, all of Japan

[73] Assignee: Fujitsu Limited, Kawasaki, Japan

[21] Appl. No.: 320,864

[22] Filed: Mar. 6, 1989

Related U.S. Application Data

[63] Continuation of Ser. No. 234,082, Aug. 19, 1988, abandoned.

[30] Foreign Application Priority Data

Aug. 19, 1987 [JP] Japan .................. 62-204205

[51] Int. Cl.⁴ .................. H01S 3/10; H01S 3/00
[52] U.S. Cl. .................. 372/26; 372/29; 372/33; 372/38
[58] Field of Search .................. 372/26, 29, 33, 38, 372/8

[56] References Cited

U.S. PATENT DOCUMENTS

| | | | |
|---|---|---|---|
| 4,243,951 | 1/1981 | Wolkstein et al. | 372/26 |
| 4,539,686 | 9/1985 | Bosch et al. | 372/26 |
| 4,594,717 | 6/1986 | Bracht et al. | 372/26 |
| 4,744,087 | 5/1988 | Nicia | 372/26 |

Primary Examiner—William L. Sikes
Assistant Examiner—Georgia Y. Epps
Attorney, Agent, or Firm—Staas & Halsey

[57] ABSTRACT

Disclosed is a semiconductor laser modulation control system, and a method thereof. The system includes a drive circuit (1) for supplying a drive current to a semiconductor laser (2) in accordance with an input data, to modulate the input data into an optical signal of the semiconductor laser (2). The optical signal is either at a high intensity state or a low intensity state in accordance with an input data of "1" or "0", in respective time slots of the input data. The system further includes a duty ratio conversion circuit (3) for converting the duty ratio of the input data in such a way that the low intensity state of the optical signal is returned to the high intensity state within each time slot of the input data, whereby the relaxation oscillation is suppressed.

17 Claims, 5 Drawing Sheets

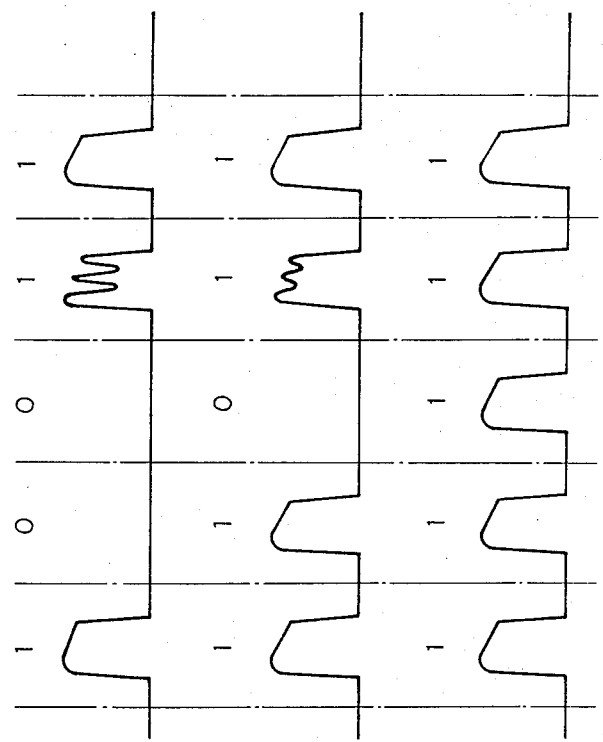
Fig. IA
Fig. IB
Fig. IC

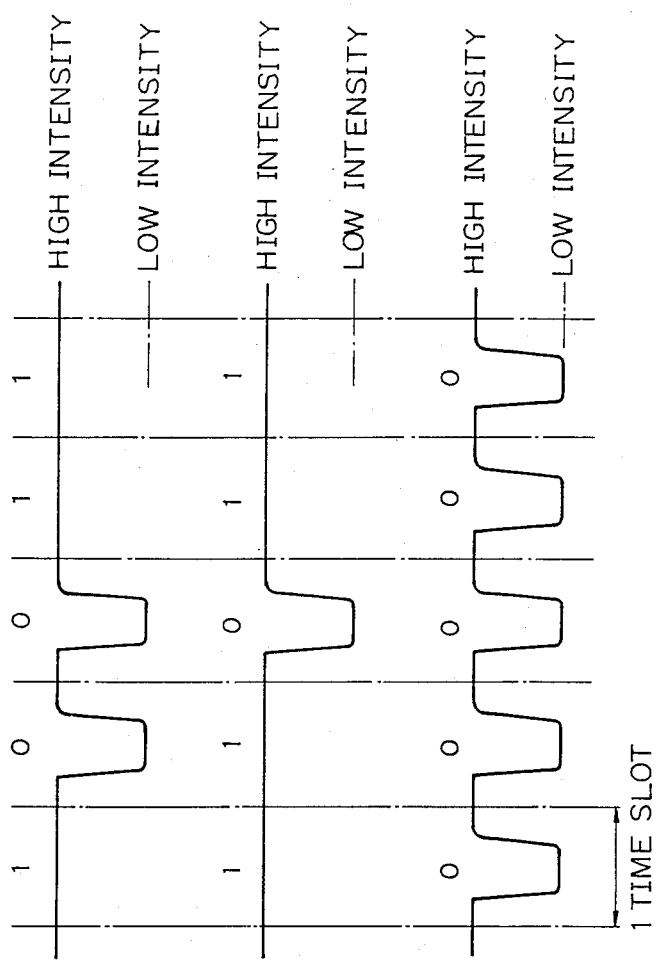

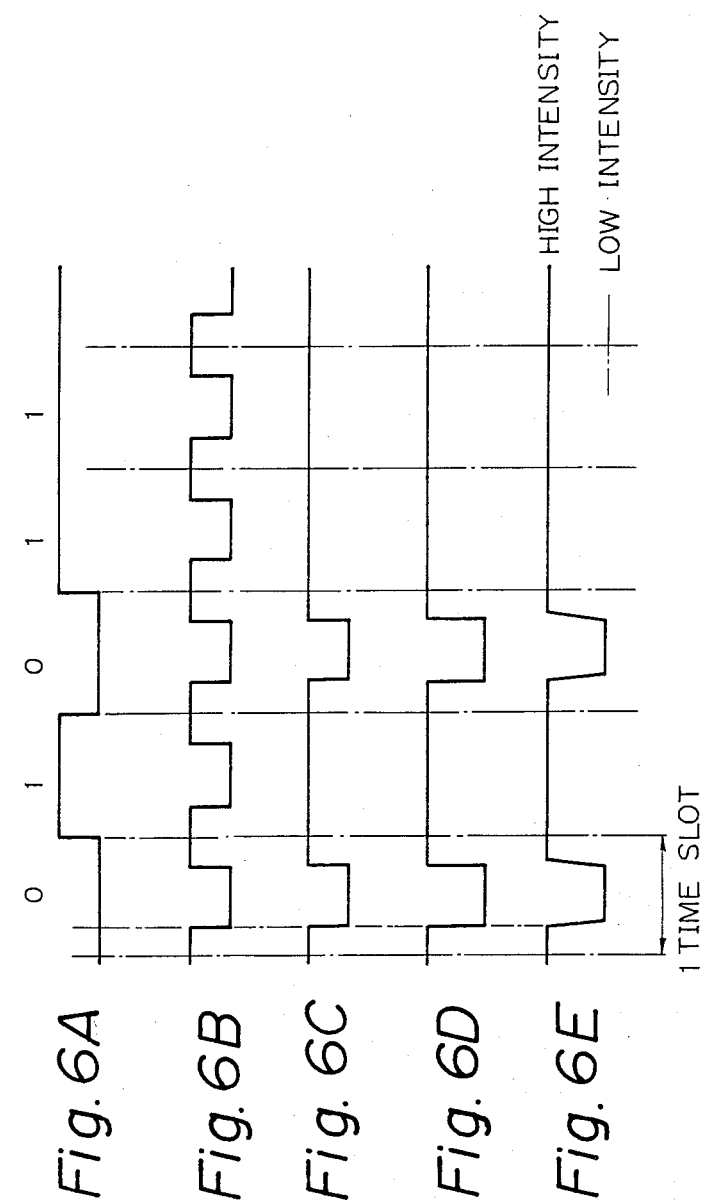

SEMICONDUCTOR LASER MODULATION CONTROL SYSTEM

This is a continuation of co-pending application Ser. No. 234,082, filed on Aug. 19, 1988, now abandoned.

BACKGROUND OF THE INVENTION

1. Field of the Invention

The present invention relates to a semiconductor laser modulation control system and a method for driving and modulating a semiconductor laser in accordance with input data.

In known digital optical communication systems, a direct modulation system is employed by which a current driving a semiconductor laser is controlled in accordance with input data. Also, due to the development of low-loss single mode optical fibers, which enable a high-speed data transmission, the semiconductor laser must be modulated and driven stably and at a high speed.

2. Description of the Related Art

In a conventional semiconductor laser direct modulation system, a current nearly equal to a threshold current needed to start a laser emission is supplied to a semiconductor laser as a bias current, to place the laser in a low intensity state, and when an input data is "1", for example, a drive current is superposed on the bias current to place the laser in a high intensity state. Namely, the intensity modulation is effected in such a way that the high intensity state is realized when the input data is, for example, "1", and the low intensity state is realized when the input data is, for example, "0", and therefore, a two-level optical signal is transmitted through an optical fiber to a receiving side.

Note, the low intensity state includes a very low intensity state at which the light emission is negligible.

FIGS. 1A to 1C are diagrams explaining a conventional example in which the high intensity state is realized when the input date is "1", the low intensity state is realized when the input date is "0", and RZ (Return to Zero) codes are employed. FIG. 1A represents the case when the input data is "10011"; FIG. 1B represents the case where the input data is "11011"; and, FIG. 1C represents the case where the input data is "11111". It will be seen from FIGS. 1A and 1B that the distortion of the optical signal wave when "1" succeeds "0" shows a relaxation oscillation pattern effect, which is considered to be due to a decrease of residual carriers in the semiconductor laser during the "0" periods. This relaxation oscillation is particularly noticeable after a long "0" period.

The optical signal is converted at a receiving side by a photo diode to an electrical signal, to identify the data "1" or "0" by a level discrimination, and thus reproduce the original data.

When a semiconductor laser is modified by high speed data of more than several Gb/s, the above mentioned pattern effect becomes notable, and if the pattern effect becomes severe, spectrum fluctuations are generated in a range whereat the relaxation oscillation is large, causing a deterioration of the received optical signal wave due to a chromatic dispersion in the optical fiber, thus increasing the discrimination errors in the received signals. The pattern effect is caused by an influence of residual carriers in the semiconductor laser. Namely, a relaxation oscillation becomes large when the residual carriers are decreased by a prolonging of the low intensity state "0" period by a series of continuous "0"s when a laser oscillation is effected by supplying a drive current.

In FIG. 1A, for example, "1" comes after two "0"s, and in this case, the residual carriers are decreased in comparison with the case shown in FIG. 1B, where "1" comes after one "0". Therefore, in the case shown in FIG. 1A, a larger relaxation oscillation and a deterioration of the optical signal wave occur than in the case shown in FIG. 1B.

In FIG. 1C, continuous "1"s are received so that the number of residual carriers is greater than a predetermined value at the times when a drive current is supplied, resulting in a small relaxation oscillation of the optical signal wave.

The problems in the conventional control system will be described in more detail with reference to FIGS. 2A to 2C.

In FIG. 2A, a dotted curve shows the relaxation oscillation at a data "1" after a series of continuous "0"s.

Further, as shown in FIG. 2B by a dotted curve, a delayed oscillation occurs in response to a rise of the input signal to "1" after a series of continuous "0"s, due to the decreased number of residual carriers in the semiconductor laser. This makes the pulse width W of the received signal narrower, and thus a deterioration of the received signal may occur after a waveform equalization thereof.

Furthermore, as shown in FIG. 2C, although the occurrence thereof has a very low probability of $10^{-11}$, the rising waveform of the oscillating signal may be fluctuated.

Moreover, after a series of continuous "0"s, chirping becomes greater and thus a deterioration of the transmitted wave form occurs. Chirping, as is well known, is a phenomenon in which the oscillating frequency is fluctuated in accordance with the carrier density in the semiconductor laser.

In a single mode semiconductor laser, when the relaxation oscillation is large, the fluctuation of the emission spectrum due to chirping or mode partitioning is increased, which causes a deterioration of the received optical signal due to a chromatic dispersion in the optical fiber, and a deterioration of eye patterns at the discriminating timings.

It is well known that the optical power can be used effectively by increasing the extinction ratio, i.e. the ratio between the high intensity state and the low intensity state optical signal levels. To increase the extinction ratio, however, the bias current supplied to the semiconductor laser must be set to a value lower than the threshold current. During modulation with high speed data, such a low bias current causes an emission delay and a large relaxation oscillation, and thus a disadvantage arises of a difficulty in producing a stable modulation drive. Accordingly, when modulation is effected with high speed data, the bias current is made high to reduce the relaxation oscillation. But, this method brings a disadvantage of a small extinction ratio.

SUMMARY OF THE INVENTION

An object of the present invention is to enable a stable modulation with high speed data while maintaining a large extinction ratio.

To attain the above object, there is provided, according to the present invention, a semiconductor laser modulation control system comprising a drive circuit for supplying a drive current to a semiconductor laser in accordance with an input data, to modulate the input data into an optical signal of said semiconductor laser. The optical signal is in either a high intensity state or a low intensity state, in accordance with an input data of "1" or "0" in respective time slots of the input data. The system further comprises a duty ratio conversion circuit receiving the input data and connected to an input of the drive circuit. The duty ratio conversion circuit converts the duty ratio of the input data in such a way that a low intensity state of the optical signal emitted from the semiconductor laser is returned to a high intensity state within each time slot of the input data.

Accordingly, since the low intensity state is returned to a high intensity state within one time slot, the amount of residual carriers in the semiconductor laser is always greater than a predetermined required value, so that a stable modulation is possible with high speed data while maintaining a large extinction ratio.

BRIEF DESCRIPTION OF THE DRAWINGS

The above object and feature of the present invention will be more apparent from the following description of the preferred embodiment, with reference to the drawings, wherein:

FIGS. 1A to 1C are diagrams explaining the operation and problems of an example of a conventional system;

FIGS. 4A to 4C are diagrams explaining the principle of the operation of the embodiment of the present invention shown in FIG. 3;

DESCRIPTION OF THE PREFERRED EMBODIMENT

An embodiment of the present invention will be described as follows.

Figures 2A, 2B, 2C:
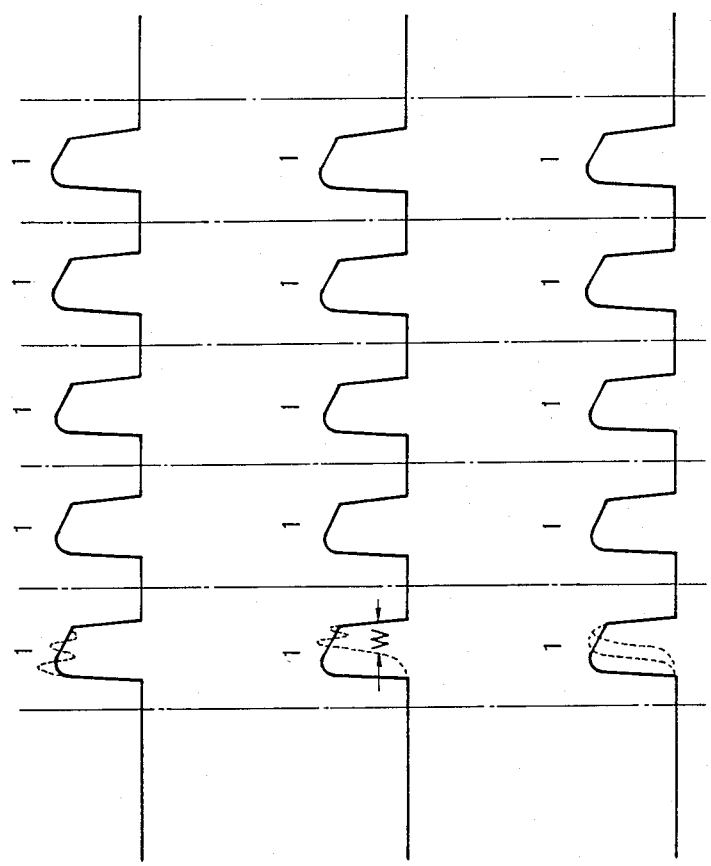
FIGS. 2A to 2C are diagrams explaining the problems of the exemplified conventional system in detail.
Figure 3:
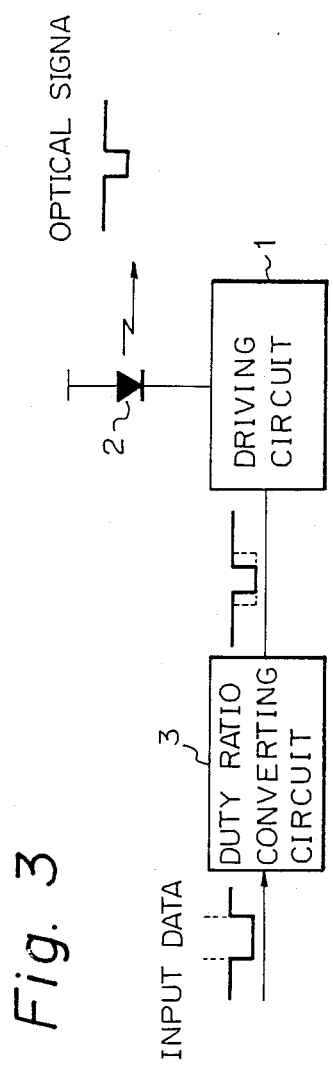
FIG. 3 is a diagram explaining the principle of an embodiment of the present invention.

First, the principle of an embodiment of the present invention will be explained with reference to FIG. 3. In FIG. 3, the semiconductor laser modulation control system includes a drive circuit 1 for supplying a drive current to a semiconductor laser 2 in accordance with an input data, to modulate the input data into an optical signal of the semiconductor laser 2. The optical signal is at either a high intensity state or a low intensity state, in accordance with an input data of "1" or "0" in respective time slots of the input data. The system further includes a duty ratio conversion circuit 3, which receives the input data. The output of the circuit 3 is connected to an input of the drive circuit 1, and the ratio conversion circuit 3 converts the duty ratio of the input data in such a way that the low intensity state of the optical signal from the semiconductor laser 2 is returned to a high intensity state within each time slot of the input data.

For example, the high intensity state is assumed when the input data is "1", and the low intensity state is assumed when the input data is "0", and the duty ratio of the signal applied to the drive circuit 1 when the optical signal is in the low intensity state is made smaller than 100%. Therefore, the duration of the low intensity state is made constant regardless of the input data pattern and, as a result, as shown in FIGS. 4A to 4C, the low intensity state is assumed when the input data is "0" and the drive control is effected such that the low intensity state is returned to the high intensity state within one time slot of the input data. Accordingly, where the input data is a series of continuous "1"'s, a continuous high intensity state optical signal is realized, and when the input data is a series of continuous "0"'s, a low intensity state is pulsatively generated to form an optical signal waveform as shown in FIG. 4C.

The emitted signal obtained as described above can therefore be referred to as a "return to one" signal.

Therefore, since the duration of the periods of a low intensity state is always constant, the amount of residual carriers in the semiconductor laser 1 is always a predetermined large value whereby, even when the bias current is made low to increase the extinction ratio, it is possible to realize a stable modulation drive in which the relaxation oscillation is small, the fluctuation of the light emission spectrum is small, and the pattern effect is small.

Figure 5:
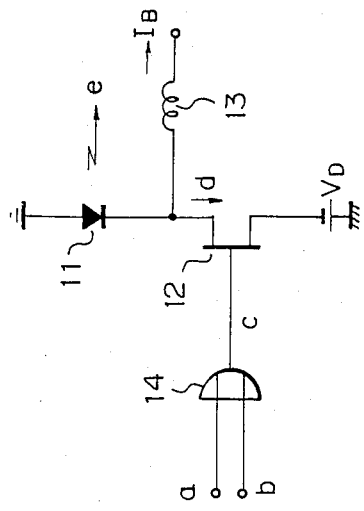
FIG. 5 is a circuit diagram of a main portion of an embodiment of the present invention; and, FIGS. 6A to 6E are diagrams explaining the operation of the embodiment of the present invention shown in FIG. 5.

FIG. 5 is a circuit diagram of a main portion of an embodiment of the present invention, in which the drive circuit 1 in FIG. 3 comprises a field effect transistor (FET) 12 and a choke coil 13, and a semiconductor laser 11 is driven by the FET 12. In FIG. 5, $I_B$ is a bias current drawn from the cathode of the semiconductor laser 11 through the choke coil 13, and $V_D$ is a source voltage of the FET 12.

The bias current $I_B$, which is nearly equal to the threshold current of the semiconductor laser 11, is supplied through the choke coil 13, and when only the bias current $I_B$ is supplied to the semiconductor laser 11, the low intensity state is realized. An input data a and a clock signal b pass through an OR gate 14 and become a signal c, which is applied to the gate of the FET 12. Then, in response to the signal c a drive current d is superposed on the bias current $I_B$ and supplied to the semiconductor laser 11, whereby a light signal e is generated.

FIGS. 6A to 6E are diagrams explaining the operation of the embodiment of the present invention. Namely, FIGS. 6A to 6E represent examples corresponding, respectively, to the signals a to e in FIG. 5. It is assumed, as an example, that an non-return to zero (NRZ) input signal a is "01011", as shown in FIG. 6A. It is also assumed that the clock signal b has a phase relationship as shown in FIG. 6B. Namely, during each time slot, the clock signal is at first at a high level, is then changed to a low level, and finally, is returned to the high level. By gating the input signal a and b through the OR gate 14, the output signal c of the OR circuit 14 is "0" when both the input data a and the clock signal b are "0", as shown in FIG. 6C, and when either the input data a or the clock signal b is "1", the output signal c of the OR gate 14 is "1". The output signal c is applied to the gate of the field effect transistor 12 so that the drive current d supplied through the FET 12 to the semiconductor laser 11 is that shown in FIG. 6D. Namely, when the output signal c of the OR gate 14 is "0", the drive current d is zero, and when the output signal c is "1", the drive current d corresponds to the source voltage $V_D$. Accordingly, the optical signal e emitted from the semiconductor laser 11 is controlled such that the duration of the period of the low intensity state corresponding to the "0" of the input data a is always constant, and further, the light signal e is returned to the high intensity state within one time slot of the input data a. Namely, the optical signal e is a "return to one" signal.

By the above described control, the number of residual carriers in the semiconductor laser 11 is relatively large even when the input data is a series of continuous "0"s, and therefore, the relaxation oscillation can be made small even when the drive current d is supplied to change the light signal e from the low intensity state to the high intensity state. In addition, since the relaxation oscillation can be made small, the fluctuation of the emission spectrum can be made small, and therefore, the influence due to the chromatic dispersion in the transmission through an optical fiber is reduced and the deterioration of the waveforms can be made small.

In the above described embodiment, the timing of the rise of the input data a is different from the timing of the rise of the clock signal b, but it will occur to those skilled in the art that the timings of the rise of the input data a and of the clock signal b can be the same.

Also, it is possible to modulate the input data so that a high intensity state of the emitted light is realized when the input data is "0" and a low intensity state is realized when the input data is "1". In this case, the control must be effected in such a way that the low intensity state is returned to the high intensity state within one time slot of the input data a.

Note, it is, of course, possible to employ a logic construction other than the construction shown in FIG. 5.

As described above, according to the present invention, a control for modulating and driving a semiconductor laser at a high intensity state or a low intensity state in accordance with an input data is carried out in such a way that a low intensity state is returned to a high intensity state within one time slot of the input data. Therefore, the duration of the period of the low intensity state becomes constant regardless of the input data pattern, and accordingly, the advantages of a small relaxation oscillation, small fluctuation of emission spectrum, and a stable modulation, even when the modulation is effected with high speed data, are obtained. Further, since the fluctuation of the emission spectrum is small even when the modulation is effected with high speed data, as described above, the influence due to chromatic dispersion when the transmission is effected through an optical fiber is reduced, so that the deterioration of the received optical waveform is made small, and thus no error will occur during the receiving discrimination.

We claim:

1. A semiconductor laser modulation control system comprising:
   a drive circuit (1) for supplying a drive current to a semiconductor laser (2) in accordance with an input data, to modulate said input data into an optical signal of said semiconductor laser (2), said optical signal being at either one of a high intensity state and a low intensity state in accordance with whether said input data is "1" and "0" in respective time slots of said input data; and
   a duty ratio conversion circuit (3) receiving said input data and having an output connected to an input of said drive circuit (1), for converting the duty ratio of said input data in such a way that said low intensity state of said optical signal is returned to said high intensity state within each time slot of said input data.

2. A semiconductor laser modulation control system as claimed in claim 1, wherein the output signal of said duty ratio converting circuit is a return to one signal.

3. A semiconductor laser modulation control system as claimed in claim 1, wherein said duty ratio conversion circuit (3) comprises an OR circuit (14) for outputting a logical sum of said input data and a clock signal said clock signal having a high level and a low level in each time slot of said input data, the logical sum being supplied to the input of said drive circuit (1).

4. A semiconductor laser modulation control system as claimed in claim 1, wherein said drive circuit (1) comprises a field effect transistor having a control electrode connected to the output of said duty ratio conversion circuit, a first electrode connected to said semiconductor laser (2) and a second electrode connected to a power supply ($V_D$).

5. A semiconductor laser modulation control system as claimed in claim 4, wherein said semiconductor laser (2) has a cathode connected to said first electrode of said field effect transistor and has an anode connected to ground.

6. A semiconductor laser modulation control system as claimed in claim 4, wherein a bias current is superposed on the drive current conducted through said field effect transistor.

7. A method for controlling modulation of a semiconductor laser comprising the steps of:
   (a) supplying a drive current to a semiconductor laser (2) in accordance with an input data, to modulate said input data into an optical signal of said semiconductor laser (2), said optical signal being at either one of a high intensity state and a low intensity state in accordance with whether said input data is "1" or "0" in respective time slots of said input data, and
   (b) converting a duty ratio of said input data in such a way that said low intensity state of said optical signal is returned to said high intensity state within each time slot of said input data.

8. A method for controlling modulation as claimed in claim 7, wherein said converting in step (b) converts the input data into a return-to-one signal.

9. A semiconductor laser modulation control system for controlling modulation of input data having high and low states, said system comprising:
   input means for receiving input data having a first duty ratio; and
   duty ratio converting means for producing an intermediate signal having high and low levels by converting the duty ratio of the input data, the intermediate signal having the high level when corresponding input data is at a high state and has both the high and low levels when the corresponding input data has a low state.

10. A semiconductor laser modulation control system as claimed in claim 9,
    wherein the intermediate signal has a second duty ratio, and
    wherein during each occurrence of the low state of the input data the intermediate signal is first at the high level, then at the low level, and finally returns to the high level.

11. A semiconductor laser modulation control system as claimed in claim 10,
    wherein said semiconductor laser modulation control system further comprises clock supply means for supplying a clock signal, and wherein said duty ratio converting means comprises an OR circuit for outputting a logical sum of the input data and the clock signal as the intermediate signal, the clock signal having a high level and a low level in each time slot of the input data.

12. A semiconductor laser modulation control system as claimed in claim 11, further comprising driving means, operatively connected to said duty ratio converting means, for receiving the intermediate signal and supplying a drive current to the semiconductor laser to modulate the input data into an optical signal having high and low intensity states and a third duty ratio.

13. A semiconductor laser modulation control system as claimed in claim 12,
wherein said semiconductor laser modulation control system includes a power supply, and
wherein said driving means comprises a field effect transistor having a control electrode connected to the output of said duty ratio converting means, a first electrode connected to the semiconductor laser and a second electrode connected to the power supply.

14. A semiconductor laser modulation control system as claimed in claim 13, wherein within each time slot the clock signal is first at the high level, then at the low level and finally returns to the high level.

15. A semiconductor laser modulation control system as claimed in claim 14, wherein the third duty ratio of the optical signal is substantially the same as the second duty ratio of the intermediate signal.

16. A method for controlling modulation using a semiconductor laser, comprising the steps of:
(a) receiving input data to be modulated, the input data varying between high and low states, and having a duty ratio therebetween;
(b) altering the duty ratio of the input data to obtain both high and low levels when the input data has the low state; and
(c) modulating the input data, after said altering of step (b), into an optical signal of the semiconductor laser.

17. A method for controlling modulation as claimed in claim 16, wherein said altering in step (b) yields a signal having a first high level, then a low level, and finally a second high level where the input data has the low state.

* * * * *